United States Patent
Hayashi et al.

(10) Patent No.: US 11,424,060 B2
(45) Date of Patent: Aug. 23, 2022

(54) SUPERCONDUCTING COIL AND SUPERCONDUCTING DEVICE

(71) Applicant: Kabushiki Kaisha Toshiba, Minato-ku (JP)

(72) Inventors: Mariko Hayashi, Shinagawa (JP); Takashi Kuboki, Ota (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 556 days.

(21) Appl. No.: 16/557,126

(22) Filed: Aug. 30, 2019

(65) Prior Publication Data
US 2020/0294698 A1 Sep. 17, 2020

(30) Foreign Application Priority Data
Mar. 15, 2019 (JP) .............................. JP2019-049190

(51) Int. Cl.
*H01F 6/02* (2006.01)
*G01R 33/34* (2006.01)
*H01F 6/06* (2006.01)

(52) U.S. Cl.
CPC ......... *H01F 6/02* (2013.01); *G01R 33/34023* (2013.01); *H01F 6/06* (2013.01)

(58) Field of Classification Search
CPC ....... H01F 6/02; H01F 6/06; G01R 33/34023; G01R 33/3815
See application file for complete search history.

(56) References Cited

U.S. PATENT DOCUMENTS 5,606,300 A * 2/1997 Koyama ................... H01F 6/06 505/879
2017/0092397 A1* 3/2017 Kawasaki ............... H01L 39/14

FOREIGN PATENT DOCUMENTS

| JP | 54-105278 U | 7/1979 |
|---|---|---|
| JP | 61-180404 A | 8/1986 |
| JP | 61-272902 A | 12/1986 |
| JP | 8-203331 A | 8/1996 |
| JP | 11-121224 A | 4/1999 |
| JP | 2010-93036 A | 4/2010 |
| JP | 2012-238634 A | 12/2012 |
| JP | 2018-129519 A | 8/2018 |
| JP | 2020-47739 A | 3/2020 |
| JP | 2020-47740 A | 3/2020 |
| JP | 2020047740 A * | 3/2020 |

* cited by examiner

*Primary Examiner* — G. M. A Hyder
(74) *Attorney, Agent, or Firm* — Oblon, McClelland, Maier & Neustadt, L.L.P.

(57) ABSTRACT

A superconducting coil of an embodiment includes a winding frame; a superconducting wire wound around the winding frame, the superconducting wire including a first region and a second region facing the first region; and a first layer placed between the first region and the second region, the first layer including a first particle and a thermosetting resin, the first particle including crystal having volume resistivity equal to or higher than $10^{-2}$ $\Omega \cdot m$ and having cleavage, and the thermosetting resin surrounding the first particle.

16 Claims, 13 Drawing Sheets

RADIAL DIRECTION OF COIL (FIRST DIRECTION)

US 11,424,060 B2

SUPERCONDUCTING COIL AND SUPERCONDUCTING DEVICE

CROSS-REFERENCE TO RELATED APPLICATION

This application is based upon and claims the benefit of priority from Japanese Patent Application No. 2019-049190, filed on Mar. 15, 2019, the entire contents of which are incorporated herein by reference.

FIELD

Embodiments described herein relate generally to a superconducting coil and a superconducting device.

BACKGROUND

For example, a superconducting coil is used to generate a strong magnetic field in a nuclear magnetic resonator (NMR) or a magnetic resonance imaging device (MRI). A superconducting coil is formed by winding of a superconducting wire around a winding frame.

When quenching in which a superconducting state of a part of the superconducting wire disappears and transitions to a normal conducting state occurs, current flowing in the superconducting coil varies and a magnetic field generated by the superconducting coil becomes unstable, for example. Also, for example, thermal runaway in which a great amount of heat is generated instantaneously may occur due to Joule heat generated in the part where the quenching occurs. When the thermal runaway occurs, there is a possibility that the superconducting coil is burned out.

As a cause of occurrence of the quenching, stress generated due to a difference in a thermal expansion coefficient between members during cooling of the superconducting coil, or stress generated by a deformation of the coil due to electromagnetic force is considered. A crack in resin included in the superconducting coil, separation between members, and movement of a coil are generated with these stress, and generation of heat associated with these phenomena is considered to be a cause of occurrence of the quenching.

DETAILED DESCRIPTION

A superconducting coil of an embodiment includes a winding frame; a superconducting wire wound around the winding frame, the superconducting wire including a first region and a second region facing the first region; and a first layer placed between the first region and the second region, the first layer including a first particle and a thermosetting resin, the first particle including crystal having volume resistivity equal to or higher than $10^{-2}$ $\Omega \cdot m$ and having cleavage, and the thermosetting resin surrounding the first particle.

In the following, embodiments of the present disclosure will be described with reference to the drawings. Note that in the following description, the same sign is assigned to identical or similar members or the like, and a description of a member or the like described once is arbitrarily omitted.

First Embodiment

A superconducting coil of the first embodiment includes a winding frame, a superconducting wire wound around the winding frame, the superconducting wire including a first region and a second region facing the first region, and a first layer placed between the first region and the second region, the first layer including a first particle and a thermosetting resin, the first particle including crystal having volume resistivity equal to or higher than $10^{-2}$ $\Omega \cdot m$ and having cleavage, and the thermosetting resin surrounding the first particle.

Figure 1:
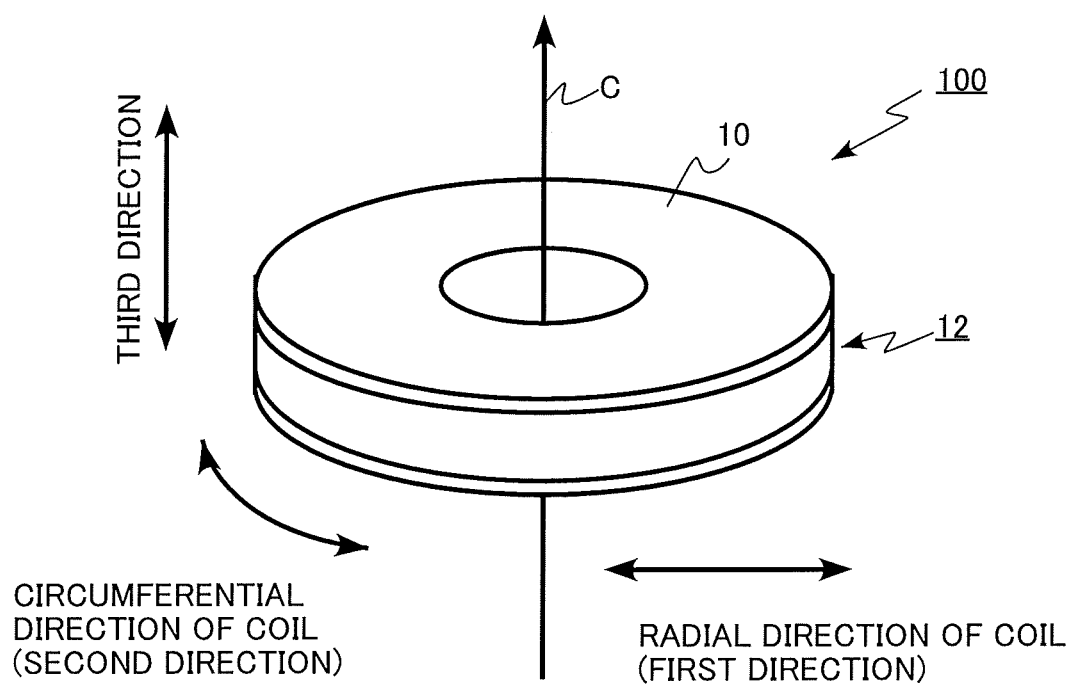
FIG. 1 is a schematic perspective view of a superconducting coil of a first embodiment.
Figure 2:
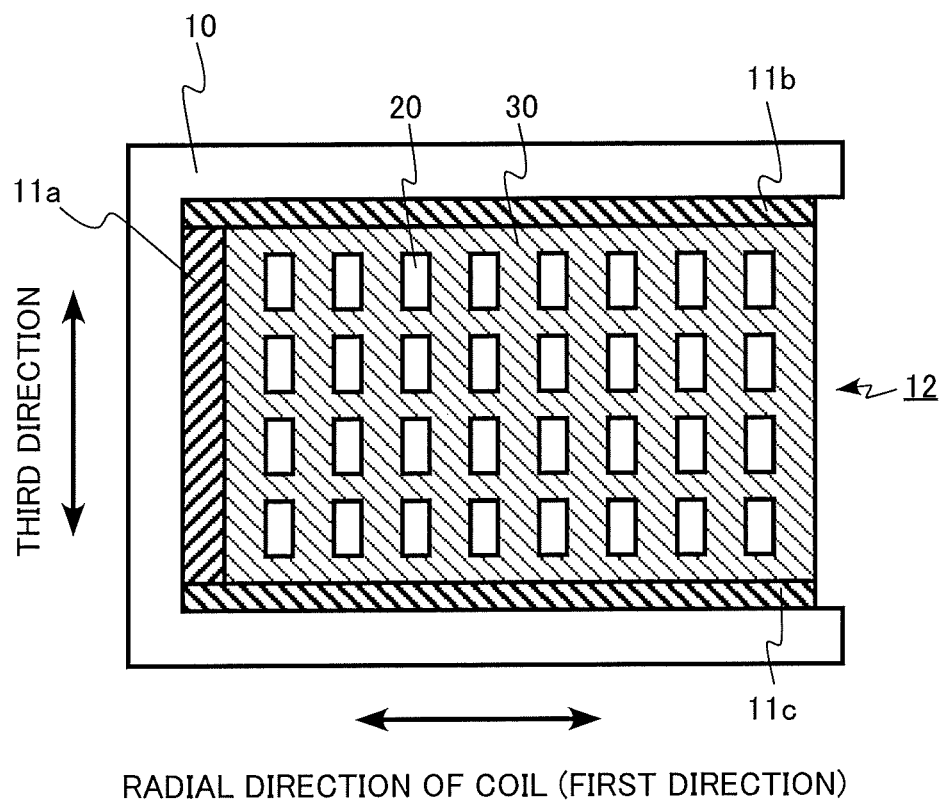
FIG. 2 is a schematic cross-sectional view of the superconducting coil of the first embodiment.
Figure 3:
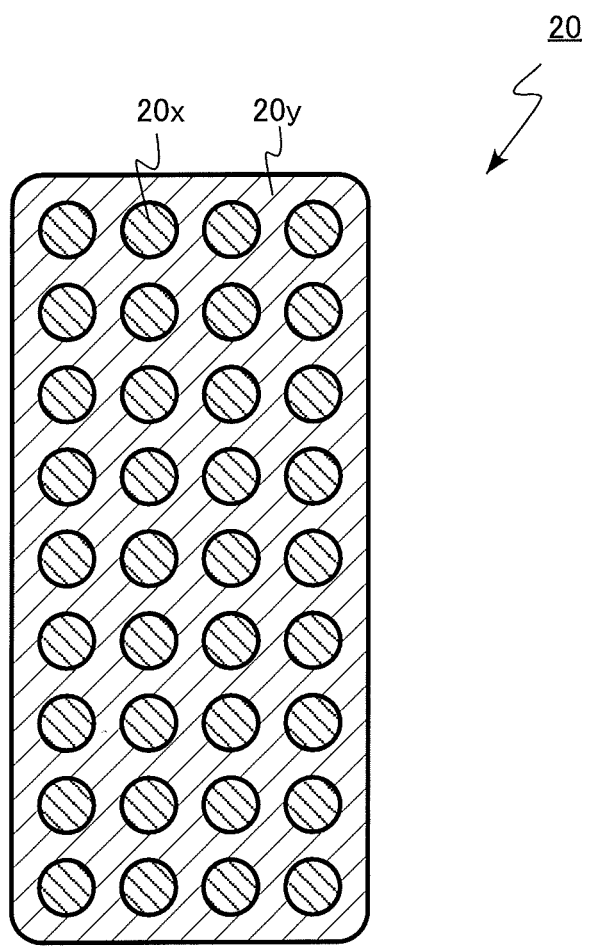
FIG. 3 is a schematic cross-sectional view of a superconducting wire of the first embodiment.

FIG. 1 is a schematic perspective view of a superconducting coil of the first embodiment. FIG. 2 is a schematic cross-sectional view of the superconducting coil of the first embodiment. FIG. 3 is a schematic cross-sectional view of a superconducting wire of the first embodiment.

A superconducting coil 100 of the first embodiment is used, for example, as a coil for generating a magnetic field of a superconducting device such as a nuclear magnetic resonator (NMR), a magnetic resonance imaging device (MRI), a heavy particle radiotherapy device, or a superconducting maglev.

The superconducting coil 100 includes a winding frame 10, an inner peripheral insulation layer 11a, an upper insulation layer 11b, a lower insulation layer 11c, and a winding part 12. The winding part 12 includes a superconducting wire 20 and a wire interlayer 30 (first layer). The wire interlayer 30 is one example of a first layer.

The superconducting wire 20 has a linear shape, for example. The superconducting wire 20 is wound around the winding frame 10 in a solenoid manner with a winding center C being a center.

The wire interlayer 30 has a function of fixing the superconducting wire 20. The wire interlayer 30 has a function of controlling destruction of the superconducting wire 20 due to vibration during use of a superconducting device or friction with each other. Also, the wire interlayer 30 has a function of insulating a gap in the superconducting wire 20.

The inner peripheral insulation layer 11a, the upper insulation layer 11b, and the lower insulation layer 11c include a fiber-reinforced plastic, for example. The inner peripheral insulation layer 11a, the upper insulation layer lib, and the lower insulation layer 11c have a function of insulating the winding part 12 from the winding frame 10 or the outside.

For example, a low-temperature superconducting substance with critical temperature Tc being equal to or higher than 8K and equal to or lower than 40K is used for the superconducting wire 20. The low-temperature superconducting substance used for the superconducting wire 20 is, for example, a niobium-titanium alloy-based, niobium-tin compound-based, niobium-aluminum compound-based, or magnesium diboride-based superconducting substance.

In FIG. 3, a case where the superconducting wire 20 is a niobium-titanium alloy-based superconducting substance is illustrated as an example. The superconducting wire 20 has a structure in which a plurality of niobium-titanium filaments 20x is disposed in a copper matrix 20y.

Figure 4:
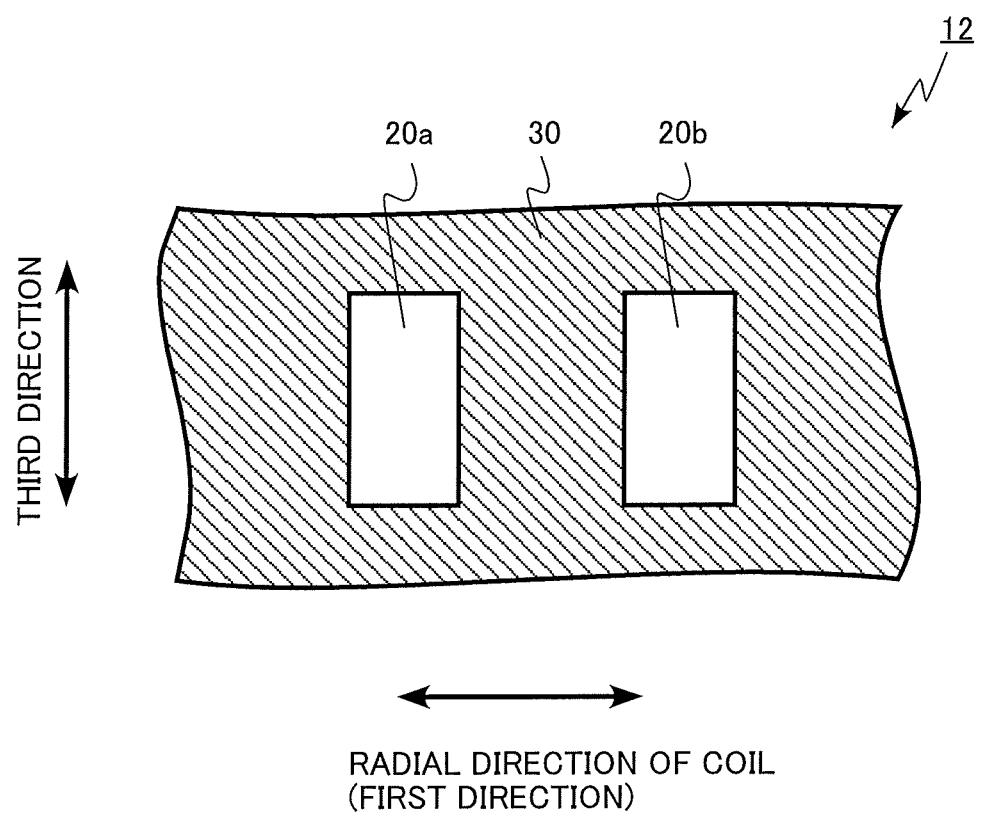
FIG. 4 is an enlarged schematic cross-sectional view of a part of a winding part of the superconducting coil of the first embodiment.

FIG. 4 is an enlarged schematic cross-sectional view of a part of the winding part of the superconducting coil of the first embodiment.

In FIG. 4, a first region 20a and a second region 20b that are a part of the superconducting wire 20 are illustrated. The second region 20b faces the first region 20a. There is the wire interlayer 30 between the first region 20a and the second region 20b.

Figure 5:
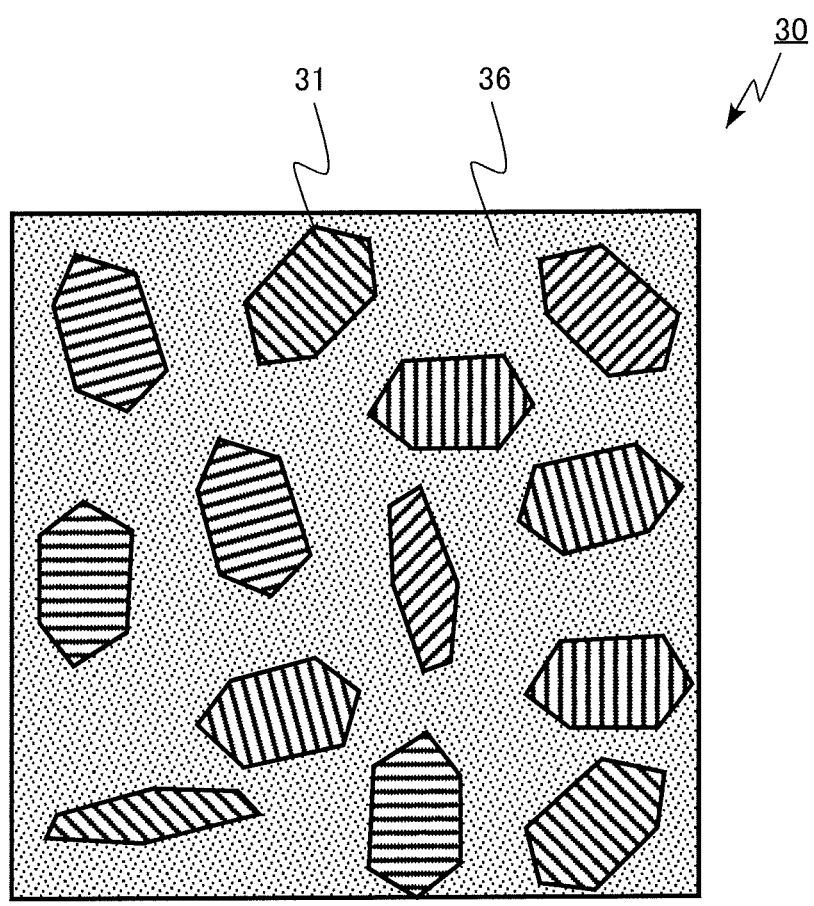
FIG. 5 is an enlarged schematic cross-sectional view of a wire interlayer of the superconducting coil of the first embodiment.

FIG. 5 is an enlarged schematic cross-sectional view of the wire interlayer of the superconducting coil of the first embodiment.

The wire interlayer 30 includes a first particle 31 and a thermosetting resin 36. The first particle 31 is a so-called filler.

The first particle 31 includes crystal volume resistivity of which is equal to or higher than $10^{-2}$ Ω·m and which has cleavage. The crystal is a principal component of the first particle 31. In the first particle 31, the crystal has a volume percent equal to or higher than 90%. The first particle 31 is, for example, the crystal itself.

The first particle 31 includes the crystal with volume resistivity being equal to or higher than $10^{-2}$ Ω·m. Volume resistivity of the first particle 31 is, for example, equal to or higher than $10^{-2}$ Ω·m and equal to or lower than $10^{15}$ Ω·m.

Also, the first particle 31 includes crystal having cleavage. The cleavage is a property that crystal is easily broken in parallel with a specific crystal plane. The cleavage is classified into perfect, good, distinct, and indistinct according to a degree thereof. For example, the first particle 31 has perfect or distinct cleavage.

The volume resistivity and the cleavage are properties unique for crystal. When crystal included in the first particle 31 is identified, volume resistivity and cleavage thereof can be determined. Crystal included in the first particle 31 can be identified, for example, by a powder X-ray diffractometry.

The crystal included in the first particle 31 is, for example, at least one of a phyllosilicate mineral and a hexagonal boron nitride. Volume resistivity of the phyllosilicate mineral and the hexagonal boron nitride is, for example, equal to or higher than $10^{-2}$ Ω·m and equal to or lower than $10^{15}$ Ω·m. Also, the phyllosilicate mineral and the hexagonal boron nitride have cleavage.

The phyllosilicate mineral has a sheet structure formed by an $SiO_2$ tetrahedron spread two-dimensionally. The phyllosilicate mineral has a tabular or flake shape and has perfect or distinct cleavage in parallel with a bottom surface.

The phyllosilicate mineral included in the first particle 31 is, for example, at least one of a mineral that belongs to a mica group, a clay mineral, pyrophyllite, and talc. The mineral that belongs to the mica group is, for example, muscovite, phlogopite, or biotite. The clay mineral is, for example, kaolinite or montmorillonite.

A shape of the first particle 31 is, for example, tabular, spherical, bale-shape, spheroid, cylindrical, fibrous, or indeterminate and is not specifically limited. In FIG. 5, a case where a shape of the first particle 31 is tabular is illustrated as an example.

A median particle size of the first particle 31 is, for example, equal to or larger than 1 μm and equal to or smaller than 10 μm. For example, by measuring major axes of a plurality of first particles 31 in an image acquired by a scanning electron microscope (SEM) (SEM image), it is possible to acquire a median particle size of the first particles 31 from the measured major axes.

The first particles 31 is scattered in random directions in the thermosetting resin 36, for example. In other words, a c-axis of crystal included in each particle faces a random direction.

The thermosetting resin 36 surrounds the first particles 31. The thermosetting resin 36 is a so-called binder. The thermosetting resin 36 adheres the first particles 31 to each other and makes the superconducting wire tightly immobilized in order to prevent movement thereof.

The thermosetting resin 36 is, for example, at least one kind of resin selected from a group including an epoxy resin, a phenolic resin, an unsaturated polyester resin, a silicone resin, a urethane resin, a urea resin, a polyimide resin, and a melamine resin.

It is possible to determine resin included in the thermosetting resin 36, for example, by a Fourier transform infrared spectrophotometer (FT-IR).

Occupancy of the first particles 31 in the wire interlayer 30 is, for example, equal to or higher than 20% and equal to or lower than 80%.

For example, a percentage of an area occupied by the first particles 31 observed in the SEM image represents the occupancy of the first particles 31 in the wire interlayer 30. The occupancy of the first particles 31 can be acquired, for example, by an image analysis of the SEM image.

The superconducting coil 100 of the first embodiment is produced by winding of the superconducting wire 20 around the winding frame 10 in a solenoid manner. The wire interlayer 30 is formed, for example, by a method of applying a material included in the wire interlayer 30 to a gap in the superconducting wire 20 and performing impregnation therewith when the superconducting wire 20 is wound. Also, for example, the wire interlayer 30 may be formed by a method of poring a material included in the wire interlayer 30 and performing impregnation therewith in vacuum in a state in which the superconducting wire 20 is wound and fixed.

In the following, a function and an effect of the superconducting coil 100 of the first embodiment will be described.

There is a case where quenching in which a superconducting state of a part of a superconducting wire of the superconducting coil disappears and transitions to a normal conducting state occurs while a superconducting device including the superconducting coil is used. Specifically, a phenomenon called training quenching may occur in a case of a superconducting coil in which a low-temperature superconducting substance with low critical temperature Tc is used as the superconducting wire 20 in a manner of the first embodiment.

The training quenching is an unstable phenomenon in which quenching occurs when an energization current value is a value lower than an energization permissible value of the superconducting wire. It is demanded to control this unstable phenomenon and to make it possible to flow a rated current in the superconducting coil stably. An operation of the superconducting coil becomes stable when it is made possible to stably flow the rated current.

As a cause of occurrence of the training quenching, stress generated due to a difference in a thermal expansion coefficient between members during cooling of the superconducting coil, or stress generated by a deformation of the coil due to electromagnetic force is considered. A crack in resin included in the superconducting coil is generated due to this stress, and generation of heat associated with this crack is considered to be a cause of occurrence of the training quenching.

The superconducting coil 100 of the first embodiment includes a first particle 31 including crystal having cleavage in the wire interlayer 30. Since having cleavage, the crystal included in the first particle 31 is broken by low stress compared to the surrounding thermosetting resin 36. Also, a crack generated by breaking of the first particle 31 stops at an interface with the thermosetting resin 36.

Thus, compared to a case where no first particle 31 is included, a large crack is less likely to be generated in the wire interlayer 30. Thus, heat generated by a crack is controlled and occurrence of quenching in the superconducting coil 100 is controlled.

Also, volume resistivity of the crystal included in the first particle 31 is equal to or higher than $10^{-2}$ Ω·m. Thus, an insulating property of the wire interlayer 30 is improved compared, for example, to a case where a conductive particle is used as a filler. Thus, flowing of current between the first region 20a and the second region 20b facing each other in the superconducting wire 20 is controlled. Thus, it is possible to stabilize a magnetic field generated by the superconducting coil 100.

Also, the superconducting coil 100 of the first embodiment uses the thermosetting resin 36 as a binder in the wire interlayer 30. Movement of the coil during energization of the superconducting coil 100 is controlled by utilization of a relatively hard thermosetting resin 36. Thus, occurrence of quenching due to movement of the coil is controlled.

Also, for example, in a case where resin softer than the thermosetting resin 36 is used as a binder, when a crack is generated in the wire interlayer 30 by stress, a phenomenon in which this crack is recovered later occurs. Thus, generation of a crack is repeated, training quenching is not ended, and an unstable operation is continued. In the superconducting coil 100 of the first embodiment, it is possible to control the above phenomenon and to perform a stable operation by using the thermosetting resin 36 as a binder in the wire interlayer 30.

It is preferable that cleavage of the crystal included in the first particle 31 is perfect. For example, cleavage of a mineral that belongs to a mica group, kaolinite, and montmorillonite is perfect.

In a viewpoint of improving an insulating property of the wire interlayer 30, volume resistivity of the crystal included in the first particle 31 is preferably equal to or higher than $10^5$ Ω·m, is more preferably equal to or higher than $10^8$ Ω·m, and is further preferably equal to or higher than $10^{10}$ Ω·m.

As described above, generation of a large crack in a wire interlayer is controlled according to the first embodiment. Thus, a superconducting coil in which occurrence of quenching is controlled can be realized.

Second Embodiment

A superconducting coil of the second embodiment is different from that of the first embodiment in a point that a first layer includes a second particle having a smaller thermal expansion coefficient than a first particle. In the following, a part of a description of contents overlapped with the first embodiment is omitted.

Figure 6:
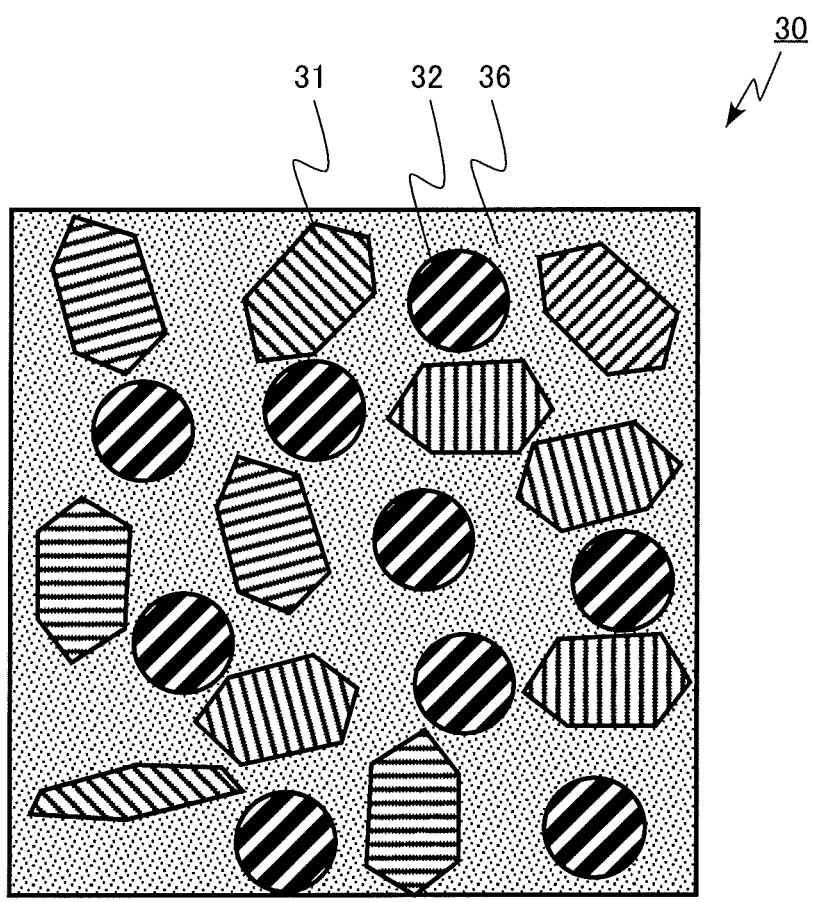
FIG. 6 is an enlarged schematic cross-sectional view of a wire interlayer of a superconducting coil of a second embodiment.

FIG. 6 is an enlarged schematic cross-sectional view of a wire interlayer of the superconducting coil of the second embodiment.

A wire interlayer 30 includes a first particle 31, a second particle 32, and a thermosetting resin 36. The first particle 31 and the second particle 32 are so-called fillers.

The first particle 31 includes crystal volume resistivity of which is equal to or higher than $10^{-2}$ Ω·m and which has cleavage.

A thermal expansion coefficient of the second particle 32 is smaller than a thermal expansion coefficient of the first particle 31. The thermal expansion coefficient of the second particle 32 is smaller than a thermal expansion coefficient of the thermosetting resin 36.

The second particle 32 includes, for example, at least one inorganic compound selected from a group including a silicon oxide, a lithium oxide, an aluminum oxide, zirconium tungstate, hafnium tungstate, zirconium phosphate, a manganese nitride, a bismuth nickel oxide, a calcium ruthenium oxide, a strontium copper iron oxide, and a silver oxide.

Since the wire interlayer 30 includes the second particle 32 having a smaller thermal expansion coefficient than the first particle 31, thermal contraction of the wire interlayer 30 in cooling of a superconducting coil 100 is controlled, for example. Thus, stress generated due to a difference in a thermal expansion coefficient between members in cooling of the superconducting coil 100 can be reduced, and generation of a large crack in a wire interlayer is controlled. Thus, occurrence of quenching is controlled.

Note that when crystal that is a principal component of the first particle 31 is specified, a thermal expansion coefficient of the first particle 31 can be represented by a thermal expansion coefficient of this crystal, for example. Also, for example, when a substance of a principal component of the second particle 32 is specified, a thermal expansion coefficient of the second particle 32 can be represented by a thermal expansion coefficient of this substance.

In a viewpoint of improving an insulating property of the wire interlayer 30, volume resistivity of the second particle 32 is preferably equal to or higher than $10^{-2}$ Ω·m, is more preferably equal to or higher than $10^5$ Ω·m, is further preferably equal to or higher than $10^8$ Ω·m, and is the most preferably equal to or higher than $10^{10}$ Ω·m.

As described above, according to the second embodiment, generation of a large crack in a wire interlayer is controlled more compared to the first embodiment. Thus, a superconducting coil in which occurrence of quenching is further controlled can be realized.

Third Embodiment

A superconducting coil of the third embodiment is different from that of the first embodiment in a point that a first layer includes a second particle having a shape or a particle size different from that of a first particle. In the following, a part of a description of contents overlapped with the first embodiment is omitted.

Figure 7:
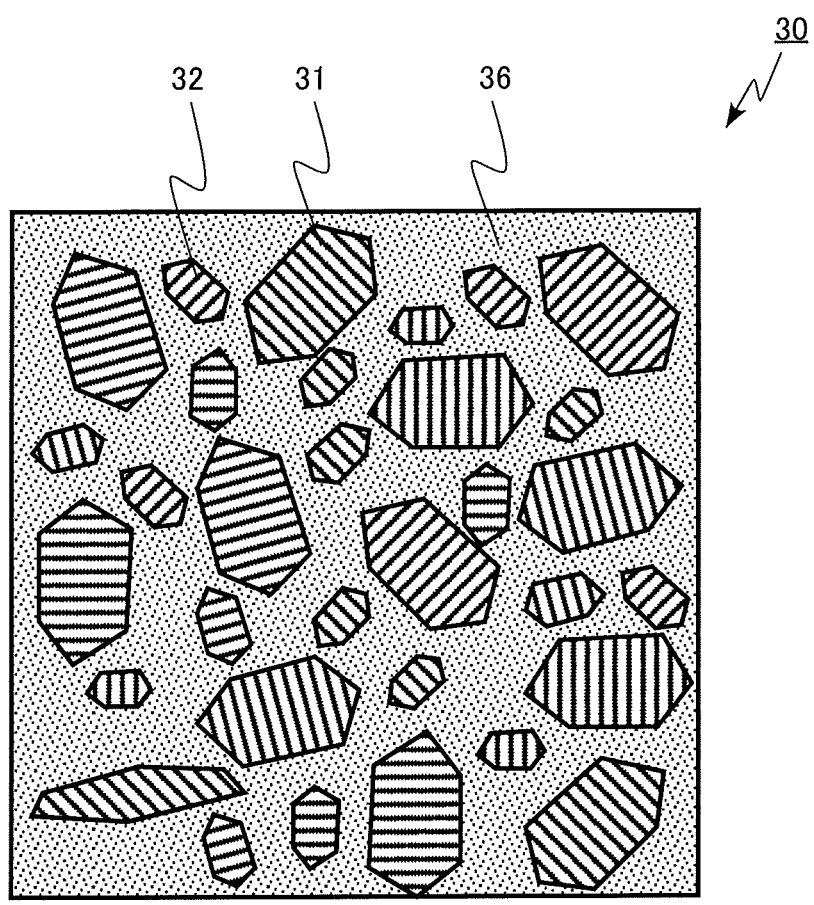
FIG. 7 is an enlarged schematic cross-sectional view of a wire interlayer of a superconducting coil of a third embodiment.

FIG. 7 is an enlarged schematic cross-sectional view of a wire interlayer of the superconducting coil of the third embodiment. In the following, a case where a second particle has a particle size different from that of a first particle will be described as an example.

A wire interlayer 30 includes a first particle 31, a second particle 32, and a thermosetting resin 36. The first particle 31 and the second particle 32 are so-called fillers.

The first particle 31 includes crystal volume resistivity of which is equal to or higher than $10^{-2}$ Ω·m and which has cleavage.

Similarly to the first particle 31, the second particle 32 includes, for example, crystal having volume resistivity equal or higher than $10^{-2}$ Ω·m and having cleavage.

The second particle 32 has a particle size different from that of the first particle 31. For example, a particle size of the second particle 32 is smaller than that of the first particle 31.

It can be determined whether the wire interlayer 30 includes a second particle 32 having a particle size different from that of the first particle 31, for example, by the following method. Major axes of a plurality of particles in the wire interlayer 30 are measured in a SEM image, and a frequency distribution of the major axes of the particles is acquired. In a case where the frequency distribution is bimodal and has two peaks, it can be determined that the wire interlayer 30 includes the second particle 32 having a particle size different from that of the first particle 31.

The superconducting coil of the third embodiment includes two kinds of particles having different sizes. Thus, it becomes possible to increase occupancy of the particles in the wire interlayer 30.

For example, in a case where the second particle 32 includes crystal having volume resistivity equal to or higher than 10-O.*m and having cleavage similarly to the first particle 31, it is possible to further control generation of a large crack since occupancy of the particles in the wire interlayer 30 is increased.

For example, in a case where a thermal expansion coefficient of the second particle 32 is smaller than a thermal expansion coefficient of the first particle 31, stress generated by a difference in a thermal expansion coefficient between members in cooling of the superconducting coil 100 can be reduced and generation of a large crack in the wire interlayer 30 can be further controlled.

Note that even in a case where the wire interlayer 30 includes the second particle 32 having a shape different from that of the first particle 31, it is possible to increase occupancy of particles in the wire interlayer 30. Thus, generation of a large crack in the wire interlayer 30 is further controlled.

As described above, according to the third embodiment, generation of a large crack in a wire interlayer is controlled more compared to the first embodiment. Thus, a superconducting coil in which occurrence of quenching is further controlled can be realized.

Fourth Embodiment

A superconducting coil of the fourth embodiment is different from that of the first embodiment in a point that a high-temperature superconducting substance is used as a superconducting wire. In the following, a part of a description of contents overlapped with the first embodiment is omitted.

Figure 8:
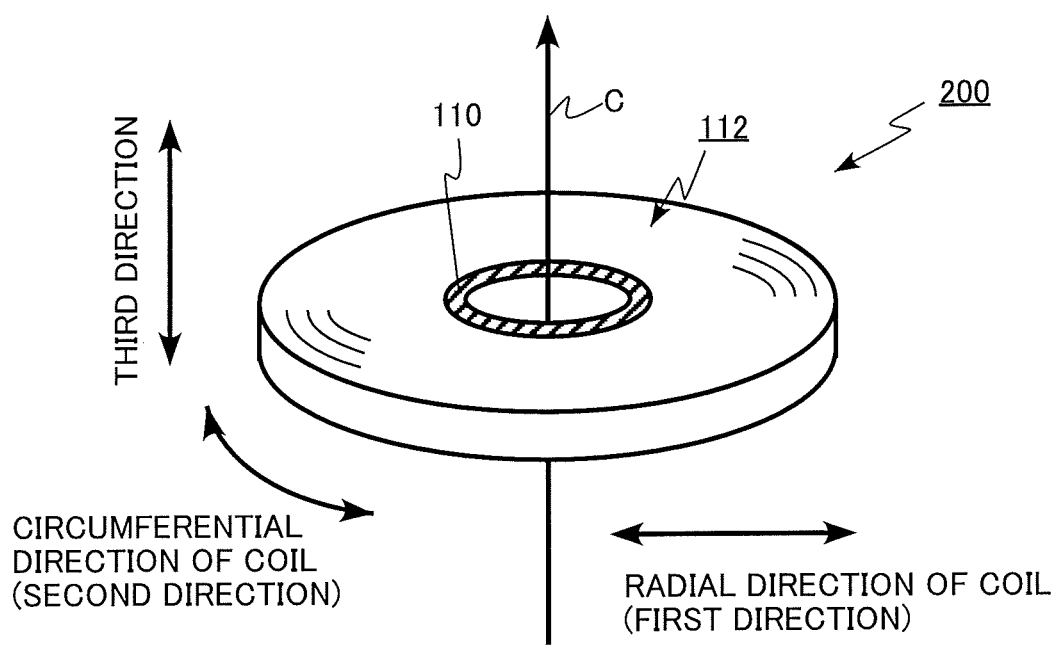
FIG. 8 is a schematic perspective view of a superconducting coil of a fourth embodiment.
Figure 9:
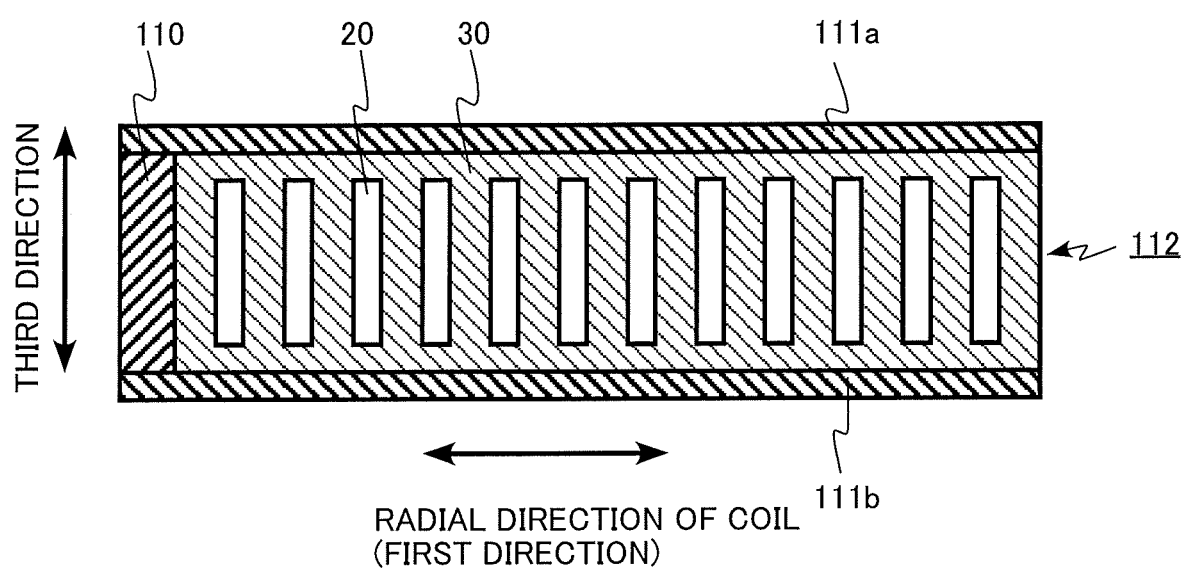
FIG. 9 is a schematic cross-sectional view of the superconducting coil of the fourth embodiment.
Figure 10:
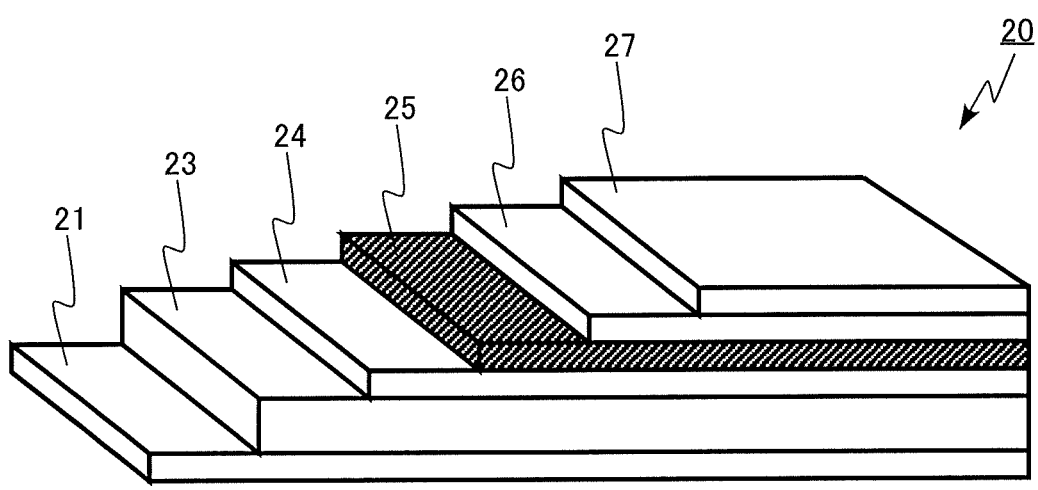
FIG. 10 is a schematic perspective view of a superconducting wire of the fourth embodiment.

FIG. 8 is a schematic perspective view of the superconducting coil of the fourth embodiment. FIG. 9 is a schematic cross-sectional view of the superconducting coil of the fourth embodiment. FIG. 10 is a schematic perspective view of a superconducting wire of the fourth embodiment.

A superconducting coil 200 of the fourth embodiment is used, for example, as a coil for generating a magnetic field of a superconducting device such as a nuclear magnetic resonator (NMR), a magnetic resonance imaging device (MRI), a heavy particle radiotherapy device, or a superconducting maglev.

The superconducting coil 200 includes a winding frame 110, a first insulating plate 111a, a second insulating plate 111b, and a winding part 112. The winding part 112 includes a superconducting wire 20 and a wire interlayer 30 (first layer). The wire interlayer 30 is one example of a first layer.

In FIG. 8, a state in which the first insulating plate 111a and the second insulating plate 111b are removed is illustrated.

The winding frame 110 includes fiber-reinforced plastic, for example. The superconducting wire 20 has, for example, a tape shape. As illustrated in FIG. 8, the superconducting wire 20 is wound around the winding frame 110 in a concentric so-called pancake shape with a winding center C being a center.

The wire interlayer 30 has a function of fixing the superconducting wire 20. The wire interlayer 30 has a function of controlling destruction of the superconducting wire 20 due to vibration during use of a superconducting device or friction with each other.

The first insulating plate 111a and the second insulating plate 111b include, for example, fiber-reinforced plastic. The first insulating plate 111a and the second insulating plate 111b have a function of insulating the winding part 112 from the outside. The winding part 112 is placed between the first insulating plate 111a and the second insulating plate 111b.

For example, a high-temperature superconducting substance with critical temperature Tc being equal to or higher than 70K is used as the superconducting wire 20.

As illustrated in FIG. 10, the superconducting wire 20 includes a first stabilized layer 21, a substrate 23, an intermediate layer 24, a superconducting layer 25, a protective layer 26, and a second stabilized layer 27. The superconducting wire 20 has a multi-layer structure.

The first stabilized layer 21 is metal. The first stabilized layer 21 is, for example, copper or aluminum.

The substrate 23 is provided on the first stabilized layer 21. The substrate 23 is metal. The substrate 23 is, for example, a high-strength metal such as a nickel-based alloy, stainless steel, or copper.

The intermediate layer 24 is provided on the substrate 23. The intermediate layer 24 has a laminated structure of a plurality of oxides. The intermediate layer 24 has a function of orienting crystal in the superconducting layer 25.

The superconducting layer 25 is provided on the intermediate layer 24. The superconducting layer 25 is, for example, an oxide including a rare-earth element. The superconducting layer 25 is, for example, an oxide superconductor including a rare-earth element, barium, and copper.

The protective layer 26 is one example of a metal layer. The protective layer 26 is provided on the superconducting layer 25. The protective layer 26 is metal. The protective layer 26 is provided in contact with the superconducting layer 25. The protective layer 26 is, for example, silver, gold, or platinum. The protective layer 26 has a function of controlling scattering of oxygen from the superconducting layer 25.

The second stabilized layer 27 is provided on the protective layer 26. The second stabilized layer 27 is metal. The second stabilized layer 27 is, for example, copper or aluminum. The second stabilized layer 27 becomes a current bypass path of when quenching occurs and has a function of controlling a thermal runaway.

Figure 11:
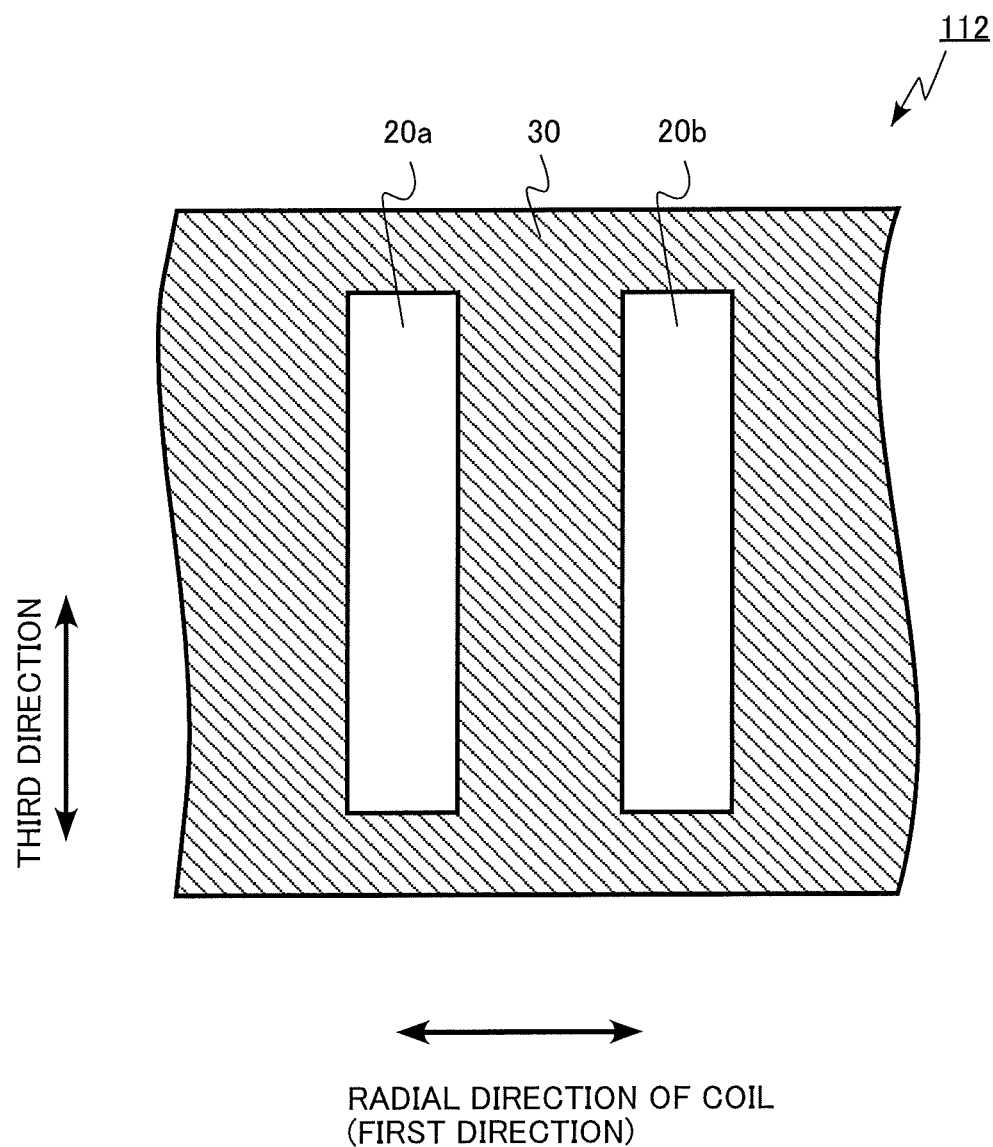
FIG. 11 is an enlarged schematic cross-sectional view of a part of a winding part of the superconducting coil of the fourth embodiment.

FIG. 11 is an enlarged schematic cross-sectional view of a part of a winding part of the superconducting coil of the fourth embodiment.

In FIG. 11, a first region 20a and a second region 20b that are a part of the superconducting wire 20 are illustrated. The second region 20b faces the first region 20a. There is the wire interlayer 30 between the first region 20a and the second region 20b.

The wire interlayer 30 of the fourth embodiment has a configuration similar to the wire interlayer 30 of the first embodiment.

In the following, a function and an effect of the superconducting coil 200 of the fourth embodiment will be described.

There is a case where quenching in which a superconducting state of a part of a superconducting wire of the superconducting coil disappears and transitions to a normal conducting state occurs while a superconducting device including the superconducting coil is used. When quenching occurs, Joule heat is generated in a part where the quenching occurs. Specifically, in a superconducting coil in which a high-temperature superconducting substance is used as a superconducting wire, a quenching propagation speed is low. With locally-generated Joule heat, there is a possibility that a great amount of heat is generated instantaneously, a hot spot is generated, and a thermal runaway occurs. When the thermal runaway occurs, there is a possibility that the superconducting coil is burned out.

As a cause of occurrence of the quenching, stress generated due to a difference in a thermal expansion coefficient between members during cooling of the superconducting coil, or stress generated by a deformation of the coil due to electromagnetic force is considered. With this stress, a crack is generated in a wire interlayer or a superconducting wire is destroyed. It is considered that generation of heat associated with this crack or destruction becomes a cause of the quenching.

For example, a thermal expansion coefficient of a resin wire interlayer is generally large compared to a metal or oxide superconducting wire.

Thus, when a superconducting coil is cooled to working temperature, thermal contraction of the wire interlayer becomes larger than thermal contraction of the superconducting wire. Thus, tensile stress is applied to the superconducting wire by cooling. It is considered that the superconducting wire is destroyed by the tensile stress and quenching occurs in the destroyed part.

Specifically, in a case where the superconducting layer 25 of the superconducting wire 20 is an oxide including a rare-earth element in a manner of the superconducting coil 200 of the fourth embodiment, the superconducting wire 20 has a multi-layer structure in which the superconducting layer 25 is in contact with the protective layer 26 that is a metal layer. Adhesion between the superconducting layer 25 and the protective layer 26 is relatively low. Here, when the tensile stress is applied to the superconducting wire 20, it is likely that the superconducting layer 25 and the protective layer 26 are separated from each other and the superconducting wire 20 is destroyed.

The superconducting coil 200 of the fourth embodiment includes a first particle 31 including crystal having cleavage in the wire interlayer 30. Since the crystal included in the first particle 31 has cleavage, the first particle 31 is broken by low stress compared to a surrounding thermosetting resin 36.

Thus, since a crack is generated in the wire interlayer 30 by low stress compared to a case where no first particle 31 is included, tensile stress applied to the superconducting wire 20 is reduced. Thus, destruction of the superconducting wire 20 by the tensile stress is controlled and occurrence of quenching is controlled.

Also, similarly to the first embodiment, a large crack is less likely to be generated in the wire interlayer 30 according to the superconducting coil 200 of the fourth embodiment compared to a case where no first particle 31 is included. Thus, heat generated by a crack is controlled and occurrence of quenching in the superconducting coil 200 is controlled.

Also, since volume resistivity of the crystal included in the first particle 31 is equal to or higher than $10^{-2}$ $\Omega \cdot m$, an insulating property of the wire interlayer 30 is improved similarly to the first embodiment. Thus, a stable operation of the superconducting coil 200 is secured.

Also, similarly to the first embodiment, occurrence of quenching due to movement of the superconducting wire is controlled by utilization of the thermosetting resin 36 as a binder in the wire interlayer 30.

As described above, destruction of the superconducting wire and occurrence of a large crack in the wire interlayer are controlled according to the fourth embodiment. Thus, a superconducting coil in which occurrence of quenching is controlled can be realized.

Fifth Embodiment

A superconducting coil of the fifth embodiment is different from that of the fourth embodiment in a point that a tape-shaped second layer placed between a first region and a second region and including resin is further included. In the following, a part of a description of contents overlapped with those of the first embodiment and the fourth embodiment is omitted.

Figure 12:
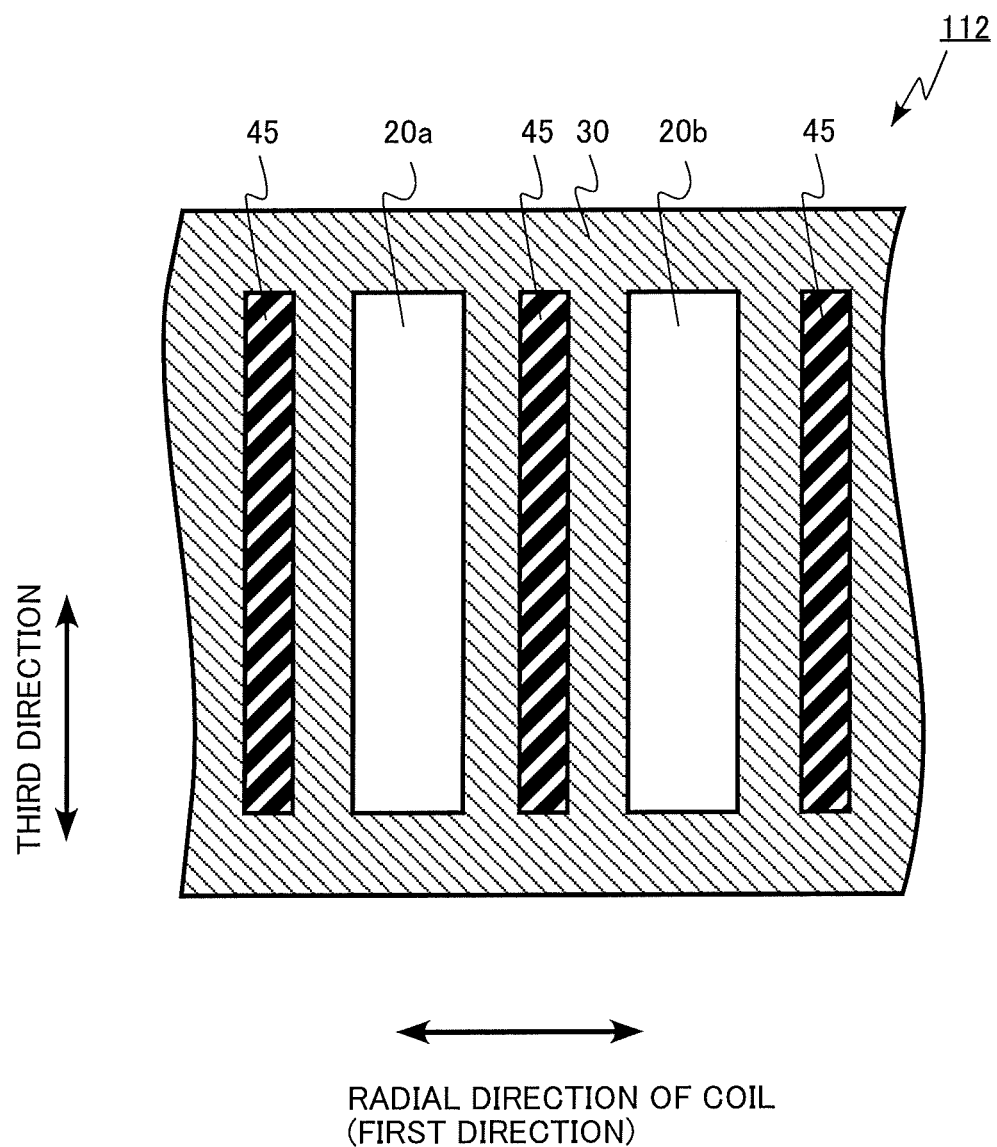
FIG. 12 is an enlarged schematic cross-sectional view of a part of a winding part of a superconducting coil of a fifth embodiment.

FIG. 12 is an enlarged schematic cross-sectional view of a part of a winding part of the superconducting coil of the fifth embodiment.

In FIG. 12, a first region 20a and a second region 20b that are a part of the superconducting wire 20 are illustrated. There is a wire interlayer 30 between the first region 20a and the second region 20b. Moreover, an insulating tape 45 (second layer) is included between the first region 20a and the second region 20b. The insulating tape 45 is one example of the second layer.

The insulating tape 45 is tape-shaped, sandwiched by the superconducting wire 20, and wound around a winding frame 10 in a solenoid manner with a winding center C as a center. The insulating tape 45 is extended in a depth direction in FIG. 12.

The insulating tape 45 includes resin. The resin included in the insulating tape 45 may be the same with or different from a thermosetting resin 36. The insulating tape 45 is, for example, a polyimide tape including polyimide.

By provision of the insulating tape 45 between the first region 20a and the second region 20b, an insulating property between the first region 20a and the second region 20b is improved, and a short circuit between the first region 20a and the second region 20b is prevented. Accordingly, occurrence of quenching is controlled, and a magnetic field generated by the superconducting coil can be stabilized.

As described above, similarly to the first embodiment, a superconducting coil in which occurrence of quenching is controlled can be realized according to the fifth embodiment.

Sixth Embodiment

A superconducting device of the sixth embodiment is a superconducting device including the superconducting coil of any one of the first to fifth embodiments. In the following, a part of a description of contents overlapped with the first to fifth embodiments is omitted.

Figure 13:
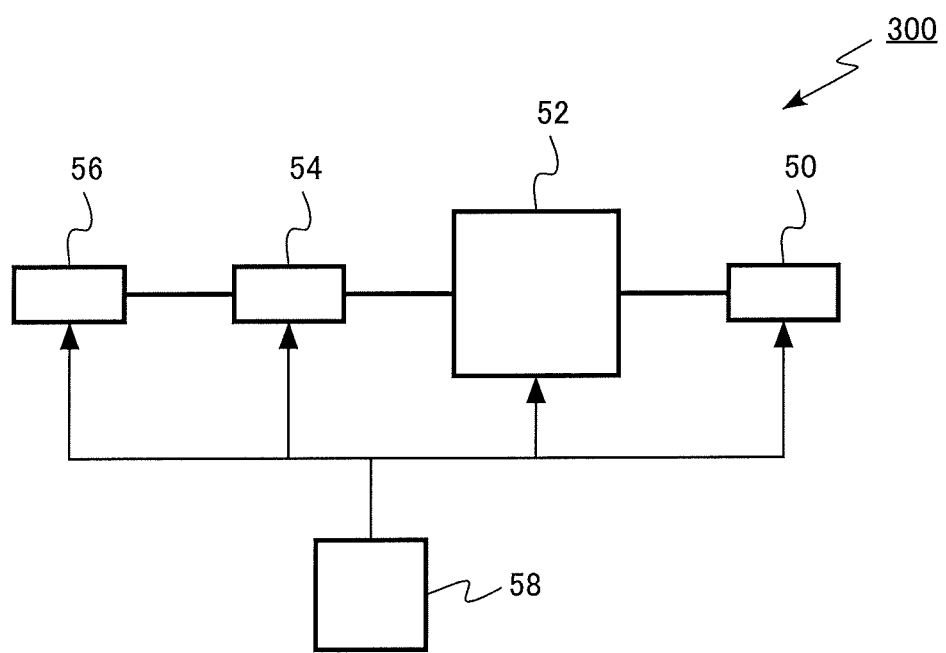
FIG. 13 is a block diagram of a superconducting device of a sixth embodiment.

FIG. 13 is a block diagram of the superconducting device of the sixth embodiment. The superconducting device of the sixth embodiment is a heavy particle radiotherapy device 300. The heavy particle radiotherapy device 300 is one example of the superconducting device.

The heavy particle radiotherapy device 300 includes an incident system 50, a synchrotron accelerator 52, a beam transport system 54, an illuminating system 56, and a control system 58.

For example, the incident system 50 has a function of generating a carbon ion used for treatment and performing preliminary acceleration for incidence to the synchrotron accelerator 52. The incident system 50 includes, for example, an ion generator and a linear accelerator.

The synchrotron accelerator 52 has a function of accelerating the carbon ion beam incident from the incident system 50 into energy suitable for treatment. The superconducting coil of any one of the first to fifth embodiments is used in the synchrotron accelerator 52.

The beam transport system 54 has a function of transporting the carbon ion beam incident from the synchrotron accelerator 52 to the illuminating system 56. The beam transport system 54 includes, for example, a bending electromagnet.

The illuminating system 56 has a function of emitting the carbon ion beam incident from the beam transport system 54 to a patient that is an object of illumination. The illuminating system 56 includes, for example, a rotating gantry that makes it possible to emit the carbon ion beam in an arbitrary direction. The superconducting coil according to any one of the first to fifth embodiments is used in the rotating gantry.

The control system 58 performs control of the incident system 50, the synchrotron accelerator 52, the beam transport system 54, and the illuminating system 56. The control system 58 is, for example, a computer.

In the heavy particle radiotherapy device 300 of the sixth embodiment, the superconducting coil of any one of the first to fifth embodiments is used in each of the synchrotron accelerator 52 and the rotating gantry. Thus, occurrence of quenching is controlled and high reliability is realized.

A case of the heavy particle radiotherapy device 300 has been described as one example of a superconducting device in the sixth embodiment. However, the superconducting device may be a nuclear magnetic resonator (NMR), a magnetic resonance imaging device (MRI), or a superconducting maglev.

While certain embodiments have been described, these embodiments have been presented by way of example only, and are not intended to limit the scope of the inventions. Indeed, a superconducting coil and a superconducting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A superconducting coil comprising:
a winding frame;
a superconducting wire wound around the winding frame, the superconducting wire including a first region and a second region facing the first region; and
a first layer placed between the first region and the second region, the first layer including a first particle and a thermosetting resin, the first particle including crystal having volume resistivity equal to or higher than $10^{-2}$ $\Omega \cdot m$ and having cleavage, and the thermosetting resin surrounding the first particle.

2. The superconducting coil according to claim 1, wherein the crystal is at least one of a phyllosilicate mineral and a hexagonal boron nitride.

3. The superconducting coil according to claim 1, wherein the thermosetting resin includes at least one kind of resin selected from a group consisting of an epoxy resin, a phenolic resin, an unsaturated polyester resin, a silicone resin, a urethane resin, a urea resin, a polyimide resin, and a melamine resin.

4. The superconducting coil according to claim 1, wherein the first layer further includes a second particle having a smaller thermal expansion coefficient than the first particle.

5. The superconducting coil according to claim 1, wherein the first layer further includes a second particle having a shape different from a shape of the first particle or a particle size different from a particle size of the first particle.

6. The superconducting coil according to claim 1, further comprising a tape-shaped second layer placed between the first region and the second region and including resin.

7. The superconducting coil according to claim 1, wherein a median particle size of the first particle is equal to or larger than 1 μm and equal to or smaller than 10 μm.

8. A superconducting device comprising:
the superconducting coil according to claim 1.

9. A superconducting coil comprising:
a winding frame;
a superconducting wire wound around the winding frame, the superconducting wire including a first region and a second region facing the first region; and
a first layer placed between the first region and the second region, the first layer including a first particle and a thermosetting resin, the first particle including at least one of a phyllosilicate mineral and a hexagonal boron nitride, and the thermosetting resin surrounding the first particle.

10. The superconducting coil according to claim 9, wherein the phyllosilicate mineral is at least one of a mineral belongs to a mica group and a clay mineral.

11. The superconducting coil according to claim 9, wherein the thermosetting resin includes at least one kind of resin selected from a group consisting of an epoxy resin, a phenolic resin, an unsaturated polyester resin, a silicone resin, a urethane resin, a urea resin, a polyimide resin, and a melamine resin.

12. The superconducting coil according to claim 9, wherein the first layer further includes a second particle having a smaller thermal expansion coefficient than the first particle.

13. The superconducting coil according to claim 9, wherein the first layer further includes a second particle having a shape different from a shape of the first particle or a particle size different from a particle size of the first particle.

14. The superconducting coil according to claim 9, further comprising a tape-shaped second layer placed between the first region and the second region and including resin.

15. The superconducting coil according to claim 9, wherein a median particle size of the first particle is equal to or larger than 1 μm and equal to or smaller than 10 μm.

16. A superconducting device comprising:
the superconducting coil according to claim 9.

* * * * *